US009837144B1

(12) United States Patent
Sinha et al.

(10) Patent No.: US 9,837,144 B1
(45) Date of Patent: Dec. 5, 2017

(54) APPARATUS AND METHOD FOR CONTROLLING BOOST CAPACITANCE FOR LOW POWER MEMORY CIRCUITS

(71) Applicant: QUALCOMM Incorporated, San Diego, CA (US)

(72) Inventors: Rakesh Kumar Sinha, Bangalore (IN); Mukund Narasimhan, Bangalore (IN); Sharad Kumar Gupta, Bangalore (IN)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/408,086

(22) Filed: Jan. 17, 2017

(51) Int. Cl.
*G11C 11/00* (2006.01)
*G11C 11/419* (2006.01)
*G11C 11/418* (2006.01)

(52) U.S. Cl.
CPC .......... *G11C 11/419* (2013.01); *G11C 11/418* (2013.01)

(58) Field of Classification Search
CPC . G11C 11/4096; G11C 7/1006; G11C 11/406; G11C 11/4091; G11C 11/4094; G11C 11/4097; G11C 7/12; G11C 7/18; G11C 8/12; G11C 11/16; G11C 11/22; G11C 11/4074; G11C 7/1075; G11C 11/161
USPC ............... 365/158, 145, 154, 171, 157, 173, 365/189.05, 189.09, 203, 222, 230.03, 365/230.06, 230.08, 51, 149
See application file for complete search history.

(56) References Cited

U.S. PATENT DOCUMENTS

| 8,004,907 B2 | 8/2011 | Russell et al. | |
|---|---|---|---|
| 9,208,860 B2 | 12/2015 | Ngo et al. | |
| 9,299,395 B2 | 3/2016 | Kulkarni et al. | |
| 2015/0103604 A1 | 4/2015 | Sheikh et al. | |
| 2015/0179232 A1* | 6/2015 | Felix ..................... | G11C 5/145 365/154 |
| 2016/0203857 A1 | 7/2016 | Chandra et al. | |

* cited by examiner

*Primary Examiner* — Thong Q Le
(74) *Attorney, Agent, or Firm* — Loza & Loza, LLP/Qualcomm (57) ABSTRACT

A memory circuit includes a set of subarrays of memory cells and a set of write assist circuits for generating negative voltages on bitlines pertaining to the set of subarrays, respectively. A set of distinct signals initiate the write assist circuits in generating the negative voltages for subarrays, respectively. The distinct signals may have particular state to cause a subset of the write assist circuits to generate the negative voltages if the corresponding subarrays are target of a writing operation, and another state to cause another subset of the write assist circuits to not generate the negative voltages if the corresponding subarrays are not target of the writing operation. This avoids the unnecessary generation of negative voltages for subarrays that are not the target of a writing operation so as to reduce power consumption. The generation of the distinct signals may be based on a set of write mask signals.

22 Claims, 6 Drawing Sheets

APPARATUS AND METHOD FOR CONTROLLING BOOST CAPACITANCE FOR LOW POWER MEMORY CIRCUITS

BACKGROUND

Field

Aspects of the present disclosure relate generally to memory devices, and in particular, to an apparatus and method for controlling boost capacitance for low power memory.

Background

A memory circuit may include a set of subarrays of memory cells, wherein each subarray includes a set of bitlines and a set of wordlines for accessing the corresponding memory cells. In low power memory circuits, a write assist circuit is employed to generate a negative voltage on a selected bitline or complementary bitline to pull down a high logic voltage that may be on the bitline to write a particular data on a memory cell coupled to the selected bitline or complementary bitline.

The negative voltage is typically formed by grounding a first terminal of a boost capacitor and applying a positive voltage to a second terminal of the boost capacitor. This causes the boost capacitor to charge to produce a negative voltage between the first and second terminals. Then, the grounding of the first terminal of the boost capacitor is removed, and the voltage on the second terminal of the boost capacitor is lowered. This causes the voltage on the first terminal of the boost capacitor to become negative. The first terminal of the boost capacitor is coupled to the selected bitline or complementary bitline to which a memory cell (being the target of a write operation) is coupled.

Typically, a low power memory circuit employs a set of write assist circuits for generating negative voltages for a set of subarrays of memory cells, respectively. The set of write assist circuits are typically driven by a common write boost signal, which initiates the generation of the negative voltages. As a result of the common write boost signal, write assist circuits are often initiated to generate negative voltages even if the corresponding subarrays of memory cells are not the target of a write operation. As a consequence, unnecessary power consumption occurs in the generation of such negative voltages.

SUMMARY

The following presents a simplified summary of one or more embodiments in order to provide a basic understanding of such embodiments. This summary is not an extensive overview of all contemplated embodiments, and is intended to neither identify key or critical elements of all embodiments nor delineate the scope of any or all embodiments. Its sole purpose is to present some concepts of one or more embodiments in a simplified form as a prelude to the more detailed description that is presented later.

An aspect of the disclosure relates to an apparatus including an array having a first subarray of memory cells coupled to a first set of bitlines and a second subarray of memory cells coupled to a second set of bitlines; a first write assist circuit configured to receive a first signal and generate a negative voltage on at least one of the first set of bitlines in response to the first signal; and a second write assist circuit configured to receive a second signal and generate a negative voltage on at least one of the second set of bitlines in response to the second signal.

Another aspect of the disclosure relates to a method including receiving a first signal; generating a negative voltage on at least one of a first set of bitlines coupled to a first subarray of an array of memory cells in response to the first signal; receiving a second signal; and generating a negative voltage on at least one of a second set of bitlines coupled to a second subarray of the array of memory cells in response to the second signal.

Another aspect of the disclosure relates to an apparatus including means for receiving a first signal; means for generating a negative voltage on at least one of a first set of bitlines coupled to a first subarray of an array of memory cells in response to the first signal; means for receiving a second signal; and means for generating a negative voltage on at least one of a second set of bitlines coupled to a second subarray of the array of memory cells in response to the second signal.

To the accomplishment of the foregoing and related ends, the one or more embodiments include the features hereinafter fully described and particularly pointed out in the claims. The following description and the annexed drawings set forth in detail certain illustrative aspects of the one or more embodiments. These aspects are indicative, however, of but a few of the various ways in which the principles of various embodiments may be employed and the description embodiments are intended to include all such aspects and their equivalents.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Some Static Random Access Memories (SRAMs) implement write assist in order to write a particular bit on one or more memory cells. Write assist typically involves generating a negative voltage on a bitline to effectively pull down a high logic voltage from a memory cell via the bitline. Typically, to implement write assist, a boost capacitor is employed to create the negative voltage on the bitline. Examples of memory circuits employing boost capacitor write assist circuits are described below.

Figure 1:
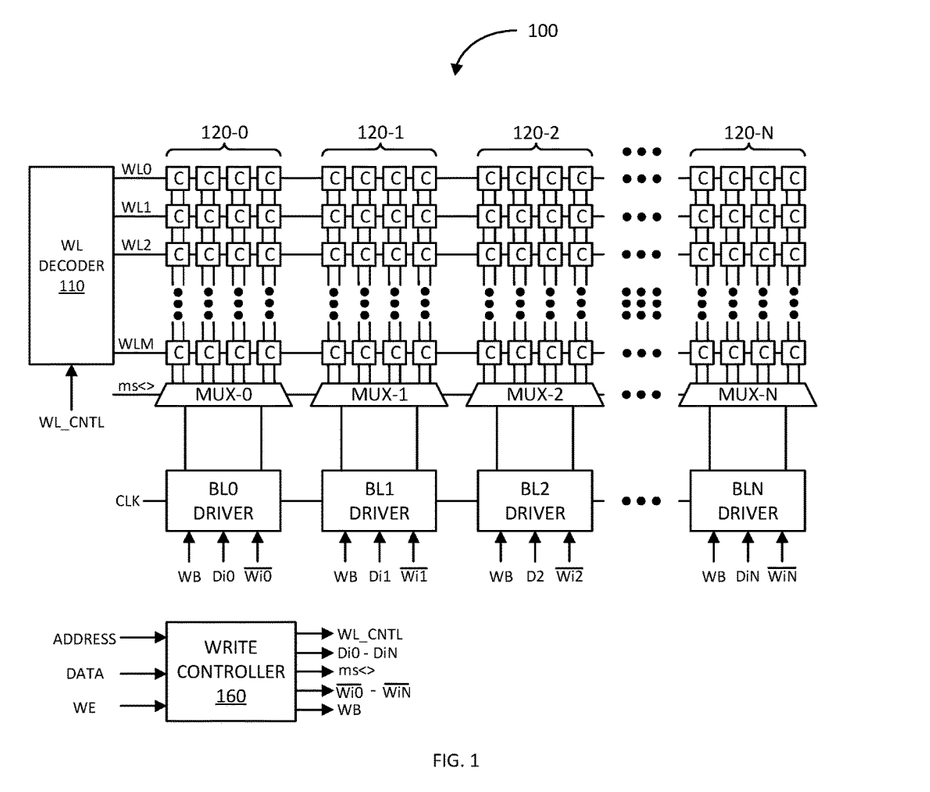
FIG. 1 illustrates a block diagram of an exemplary memory circuit in accordance with an aspect of the disclosure.

FIG. 1 illustrates a block diagram of an exemplary memory circuit 100 in accordance with an aspect of the disclosure. The memory circuit 100 includes a set of one or more arrays or subarrays of memory cells C 120-0 to 120-N (referred to hereinafter as "subarrays"). In this example, each of the memory subarrays 120-0 to 120-N is configured as a two-dimensional subarray of memory cells C, with a subarray size of four (4) by (M+1) memory cells. It shall be understood that each of the subarrays 120-0 to 120-N may be configured into any size array.

Memory cells C of the subarrays 120-0 to 120-N common to rows are coupled to corresponding wordlines WL0 to WLM, respectively. For accessing rows of memory cells C for the purpose of writing or reading data to or from the memory cells, the memory circuit 100 includes a wordline (WL) decoder 110 coupled to the wordlines WL0 to WLM. For example, to access a particular row of memory cells for writing or reading purposes, the WL decoder 110 generates an asserted signal on the corresponding wordline (e.g., a logic high voltage).

The memory circuit 100 may optionally include a set of column multiplexers MUX-0 to MUX-N coupled to columns of memory cells C of the set of subarrays 120-0 to 120-N. Each of the column multiplexers MUX-0 to MUX-N includes a pair of complementary inputs. Additionally, each of the column multiplexers MUX-0 to MUX-N includes four (4) pairs of complementary outputs coupled to corresponding columns of memory cells C of the subarrays 120-0 to 120-N via complementary bitlines, respectively. Further, each of the column multiplexers MUX-0 to MUX-N includes a select input configured to receive a multiplexer select signal ms<3:0>.

The memory circuit 100 further includes a set of bitline drivers BL0 to BLN coupled to the pair of complementary inputs of the set of column multiplexers MUX-0 to MUX-N, respectively. Each of the bitline drivers BL0 to BLN is configured to receive a clock signal CLK and a write boost signal WB. The bitline drivers BL0 to BLN are configured to receive write data signals Di0 to DiN and write mask signals $\overline{W_1 0}$ to $\overline{W_1 N}$, respectively. Based on these signals, the bitline drivers BL0 to BLN are configured to write data to selected one or more memory cells C of one or more of the subarrays 120-0 to 120-N.

The memory circuit 100 further includes a write controller 160 to effectuate the writing of data into memory cells C of the subarrays 120-0 to 120-N. The write controller 160 receives an address signal identifying one or more memory cells to which data is to be written per a writing operation. The write controller 160 also receives a data signal specifying the data to be written into the memory cells identified by the address information. And, the write controller 160 receives a write enable (WE) signal initiating the writing of data into the selected memory cells per a writing operation. Based on these received signals, the write controller 160 generates a wordline control signal WL_CNTL, the data signals Di0 to DiN, the column multiplexer select signal ms<3:0>, the write mask signals $\overline{W_1 0}$ to $\overline{W_1 N}$, and the write boost signal WB.

More specifically, when data is to be written into one or more selected memory cells C identified by the address signal, the write controller 160 generates the wordline control signal WL_CNTRL to cause the WL decoder 110 to generate an asserted signal on the wordline coupled to the selected one or more memory cells C. The WL decoder 110 also maintains the signals on the remaining wordlines deasserted. For instance, if data is to be written into one or more memory cells coupled to wordline WL1, the WL decoder 110 generates an asserted signal (e.g., a high logic voltage) on wordline WL1, and deasserted signals (e.g., a low logic voltage) on wordlines WL0 and WL2-WLM.

Additionally, based on the address signal, the write controller 160 generates the multiplexer select signal ms<3:0> to select one of the four (4) complementary bitlines to which the selected one or more memory cells C of the subarrays 120-0 to 120-N are coupled. For instance, if data is to be written into memory cells C in the first column of each of one or more of the subarrays 120-0 to 120-N, the write controller 160 generates the multiplexer select signal ms<3:0> as a "1000". This causes column multiplexers MUX-0 to MUX-N to couple their complementary inputs to the first set of complementary outputs.

Further, based on the received data signal, the write controller 160 generates the data signals Di0 to DiN, the write mask signals $\overline{W_1 0}$ to $\overline{W_1 N}$, and the write boost signal WB to cause the bitline drivers BL0 to BLN to generates complementary bitline signals for writing data into the selected one or more memory cells C. The data signals Di0 to DiN include the data to be written to the selected one or more memory cells C of the subarrays 120-0 to 120-N, respectively. The input write mask signals $\overline{W_1 0}$ and $\overline{W_1 N}$, when asserted (e.g., at a high logic voltage), masks the writing of data to one or more memory cells of the subarrays 120-0 to 120-N, respectively. The bitline drivers BL0 to BLN timely generate the complementary bitline signals based on the clock signal CLK (e.g., based on a rising edge of the clock signal CLK). The bitline drivers BL0 to BLN also use the write boost signal WB to generate a negative voltage on a corresponding bitline to pull down a high logic voltage that may be present on that bitline.

For example, if a particular memory cell C is programmed with a logic one (1), the corresponding bitline BL will be at a high logic voltage and the corresponding complementary bitline $\overline{BL}$ will be at a low logic voltage. Accordingly, if this particular memory cell is to be programmed with a logic zero (0), the corresponding bitline driver, using the write boost signal WB, generates a negative voltage on the corresponding bitline BL to pull down the high logic voltage to a low logic voltage. The corresponding bitline driver also generates a high logic voltage on the corresponding complementary bitline $\overline{BL}$. Both of these actions cause the memory cell C to be programmed with a logic zero (0).

Similarly, if the particular memory cell C is programmed with a logic zero (0), the corresponding bitline BL will be at a low logic voltage and the corresponding complementary bitline $\overline{BL}$ will be at a high logic voltage. Accordingly, if this particular memory cell is to be programmed with a logic one (1), the corresponding bitline driver, using the write boost signal WB, generates a negative voltage on the corresponding complementary bitline $\overline{BL}$ to pull down the high logic voltage to a low logic voltage. The corresponding bitline driver also generates a high logic voltage on the corresponding bitline BL. Both of these actions cause the memory cell C to be programmed with a logic one (1).

Figure 2A:
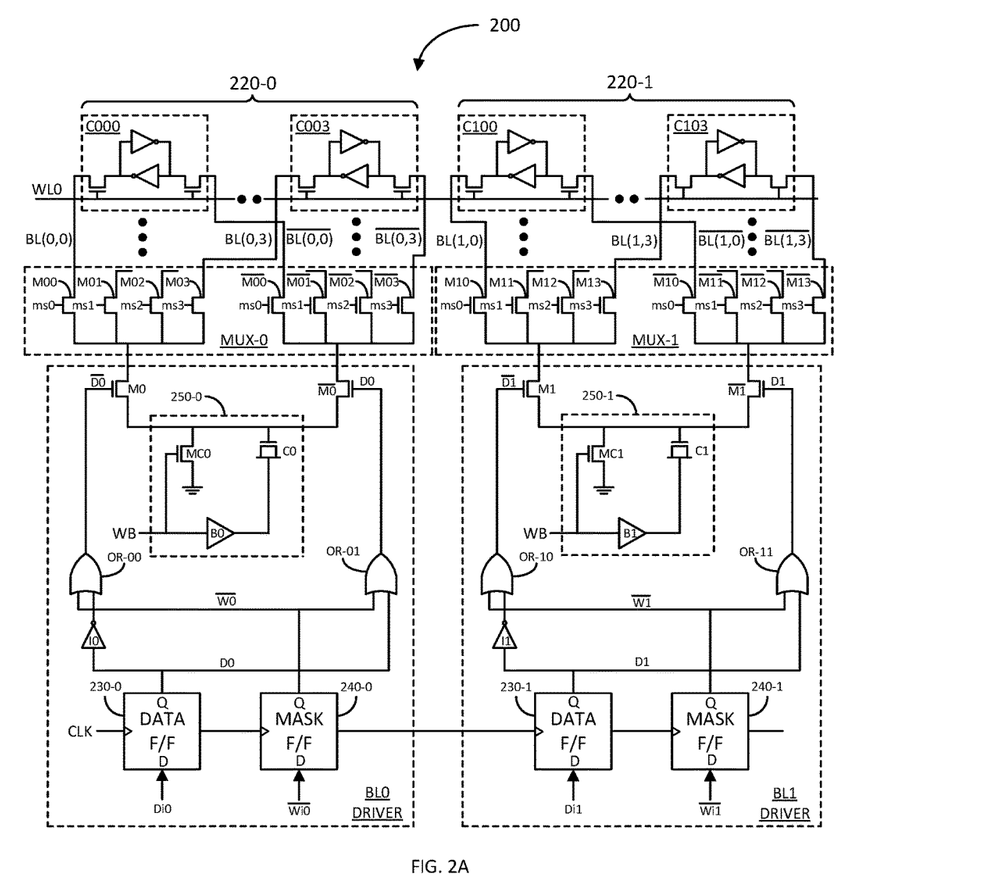
FIG. 2A illustrates a schematic diagram of another exemplary memory circuit in accordance with another aspect of the disclosure.

FIG. 2A illustrates a schematic diagram of another exemplary memory circuit 200 in accordance with an aspect of the disclosure. The memory circuit 200 may be an exemplary more detailed implementation of the memory circuit 100 previous discussed.

In particular, the memory circuit 200 includes a first subarray of memory cells 220-0 (e.g., an (M+1) row by 4 column subarray) and a second subarray of memory cells 220-1 (e.g., 9M+1)×4 subarray). For simplicity reasons, representative memory cells C000 and C003 of the first subarray 220-0 are illustrated (where the indices indicate subarray 220-0, wordline WL0, and bitlines BL(0,0) and BL(0,3), respectively). Similarly, representative memory cells C100 and C103 of the second subarray 220-1 are illustrated (where the indices indicate subarray 220-1, wordline WL0, and bitlines BL(1,0) and BL(1,3), respectively).

As illustrated, each of the memory cells may be configured as a static random access memory (SRAM) memory cell. In this regard, each memory cell includes cross-coupled inverters for latching the particular data, and a pair of access transistors coupled between the cross-coupled inverters and the corresponding non-complementary and complementary bitlines. The access transistors may be configured as n-channel metal oxide semiconductor (NMOS) field effect transistor (FETs) with gates coupled to a corresponding wordline. Each of the inverters may be configured as a p-channel metal oxide semiconductor (PMOS) FET coupled in series with an NMOS FET between an upper voltage rail and a lower voltage rail. For implementing the cross-coupling, the gates of the PMOS-NMOS of a first inverter are coupled to the drains of the PMOS-NMOS of the second inverter, and the gates of the PMOS-NMOS of the second inverter are coupled to the drains of the PMOS-NMOS of the first inverter.

With regard to the first subarray 220-0, the memory cell C000 (including the remaining memory cells in column zero (0) are coupled to bitline BL(0,0) and complementary bitline $\overline{BL(0,0)}$. The memory cells in columns 1-3 of the first subarray 220-0 are coupled to bitlines BL(0,1)-BL(0,3) and complementary bitlines $\overline{BL(0,1)}$-$\overline{BL(0,3)}$, respectively. Memory cells common to rows 0 to M are coupled to a corresponding wordlines WL0 to WLM (e.g., only wordline WL0, coupled to memory cells C000 and C003, is explicitly shown for simplicity reasons).

Similarly, with regard to the second subarray 220-1, the memory cell C100 (including the remaining memory cells in column zero (0) are coupled to bitline BL(1,0) and complementary bitline $\overline{BL(1,0)}$. The memory cells in columns 1-3 of the second subarray 220-1 are coupled to bitlines BL(1,1)-BL(1,3) and complementary bitlines $\overline{BL(1,1)}$-$\overline{BL(1,3)}$, respectively. Memory cells common to rows 0 to M are coupled to corresponding wordlines WL0 to WLM (e.g., only wordline WL0, coupled to memory cells C100 and C103, is explicitly shown for simplicity reasons).

The memory circuit 200 further includes a column multiplexer MUX-0 with a first set of four select transistors M00-M03 coupled to bitlines BL(0,0) to BL(0,3) and a second set of four select transistors $\overline{M00}$-$\overline{M03}$ coupled to complementary bitlines $\overline{BL(0,0)}$ to $\overline{BL(0,3)}$, respectively. Each of the select transistors M00-M03 and $\overline{M00}$-$\overline{M03}$ may be configured as an NMOS FET. Accordingly, the drains of the select transistors M00-M03 and $\overline{M00}$-$\overline{M03}$ are coupled to bitlines BL(0,0) to BL(0,3) and complementary bitlines $\overline{BL(0,0)}$ to $\overline{BL(0,3)}$, respectively. The sources of select transistors M00-M03 and $\overline{M00}$-$\overline{M03}$ serve as the complementary inputs to the column multiplexer MUX-0. The first and second sets of select transistors M00-M03 and $\overline{M00}$-$\overline{M03}$ include control terminals (e.g., gates) configured to receive the four bits of the multiplexer select signal ms<3:0>, respectively.

Similarly, the memory circuit 200 further includes a column multiplexer MUX-1 with a first set of four select transistors M10-M13 coupled to bitlines BL(1,0) to BL(1,3) and a second set of four select transistors $\overline{M10}$-$\overline{M13}$ coupled to complementary bitlines $\overline{BL(1,0)}$ to $\overline{BL(1,3)}$, respectively. Each of the select transistors M10-M13 and $\overline{M10}$-$\overline{M13}$ may be configured as an NMOS FET. Accordingly, the drains of the select transistors M10-M13 and $\overline{M10}$-$\overline{M13}$ are coupled to bitlines BL(1,0) to BL(1,3) and complementary bitlines $\overline{BL(1,0)}$ to $\overline{BL(1,3)}$, respectively. The sources of select transistors M00-M03 and $\overline{M00}$-$\overline{M03}$ serve as the complementary inputs to the column multiplexer MUX-1. The first and second sets of select transistors M10-M13 and $\overline{M10}$-$\overline{M13}$ include control terminals (e.g., gates) configured to receive the four bits of the multiplexer select signal ms<3:0>, respectively.

Additionally, the memory circuit 200 includes a bitline driver BL0. The bitline driver BL0 includes a data flip-flop 230-0, a write mask flip-flop 240-0, an inverter I0, OR-gates OR-00 and OR-01 (which may be each implemented as a NOR-gate followed by an inverter), complementary write transistors M0 and $\overline{M0}$ (e.g., NMOS FETs), and a write assist circuit 250-0. The write assist circuit 250-0, in turn, includes a buffer B0, a transistor MC0 (e.g., an NMOS FET), and a boost capacitor C0 (e.g., an NMOS FET with drain and source connected together).

The data flip-flop 230-0 includes a data input (D) configured to receive an input data signal Di0 and a clock input (>) configured to receive a clock signal CLK. The data flip-flop 230-0 includes a data output (Q) coupled to an input of the inverter I0 and a first input of OR-gate OR-01. The inverter I0, in turn, includes an output coupled to a first input of OR-gate OR-00. The data output (Q) of the data flip-flop 230-0 is configured to produce the latched input data D0. The outputs of the OR-gates OR-00 and OR-01 are configured to produce the latched complementary input data $\overline{D0}$ and latched input data D0, respectively.

Similarly, the write mask flip-flop 240-0 includes a data input (D) configured to receive an input write mask signal $\overline{W_i0}$ and a clock input (>) configured to receive the clock signal CLK. The write mask flip-flop 240-0 includes a data output (Q) coupled to second inputs of OR-gates OR-00 and OR-01, respectively. The data output (Q) of the write mask flip-flop 230-0 is configured to produce the latched input mask signal $\overline{W0}$.

The OR-gates OR-00 and OR-01 include outputs coupled to control inputs (e.g., gates) of the complementary write transistors M0 and $\overline{M0}$, respectively. The write transistors M0 and $\overline{M0}$ include respective first terminals (e.g., drains) coupled to the complementary inputs of the column multiplexer MUX-0, respectively. The write transistors M0 and $\overline{M0}$ include respective second terminals (e.g., sources) coupled to terminals (e.g., drain and gate) of transistors MC0 and C0 of the write assist circuit 250-0.

The transistor MC0 includes a terminal (e.g., source) coupled to a lower voltage rail (e.g., ground). The control terminal (e.g., gate) of transistor MC0 and an input of the buffer B0 are configured to receive a write boost signal WB. The buffer B0 includes an output coupled to terminals (e.g., drain and source) of the capacitor-configured transistor C0.

Additionally, the memory circuit 200 further includes another bitline driver BL1. The bitline driver BL1 includes a data flip-flop 230-1, a write mask flip-flop 240-1, an inverter I1, OR-gates OR-10 and OR-11 (which may each be implemented as a NOR-gate followed by an inverter), complementary write transistors M1 and $\overline{M1}$ (e.g., NMOS FETs), and a write assist circuit 250-1. The write assist circuit 250-1, in turn, includes a buffer B1, a transistor MC1

(e.g., an NMOS FET), and a boost capacitor C1 (e.g., an NMOS FET with drain and source connected together).

The data flip-flop 230-1 includes a data input (D) configured to receive an input data signal Di1 and a clock input (>) configured to receive the clock signal CLK. The data flip-flop 230-1 includes a data output (Q) coupled to an input of the inverter I1 and a first input of OR-gate OR-11. The inverter IL in turn, includes an output coupled to a first input of OR-gate OR-10. The data output (Q) of the data flip-flop 230-1 is configured to produce the latched input data DE The outputs of the OR-gates OR-10 and OR-11 are configured to produce the latched complementary input data D1 and latched input data D1, respectively.

Similarly, the write mask flip-flop 240-1 includes a data input (D) configured to receive an input write mask signal $\overline{W_1 1}$ and a clock input (>) configured to receive the clock signal CLK. The write mask flip-flop 240-1 includes a data output (Q) coupled to second inputs of OR-gates OR-10 and OR-11, respectively. The data output (Q) of the write mask flip-flop 240-1 is configured to produce the latched input mask signal $\overline{W1}$.

The OR-gates OR-10 and OR-11 include outputs coupled to control inputs (e.g., gates) of the complementary write transistors M1 and $\overline{M1}$, respectively. The write transistors M1 and $\overline{M1}$ include respective first terminals (e.g., drains) coupled to the complementary inputs of the column multiplexer MUX-1, respectively. The write transistors M1 and $\overline{M1}$ include respective second terminals (e.g., sources) coupled to terminals (e.g., drain and gate) of transistors MC1 and C1 of the write assist circuit 250-1.

The transistor MC1 includes a terminal (e.g., source) coupled to a lower voltage rail (e.g., ground). The control terminal (e.g., gate) of transistor MC1 and an input of the buffer B1 are configured to receive the write boost signal WB. The buffer B1 includes an output coupled to terminals (e.g., drain and source) of the capacitor-configured transistor C1.

Figure 2B:
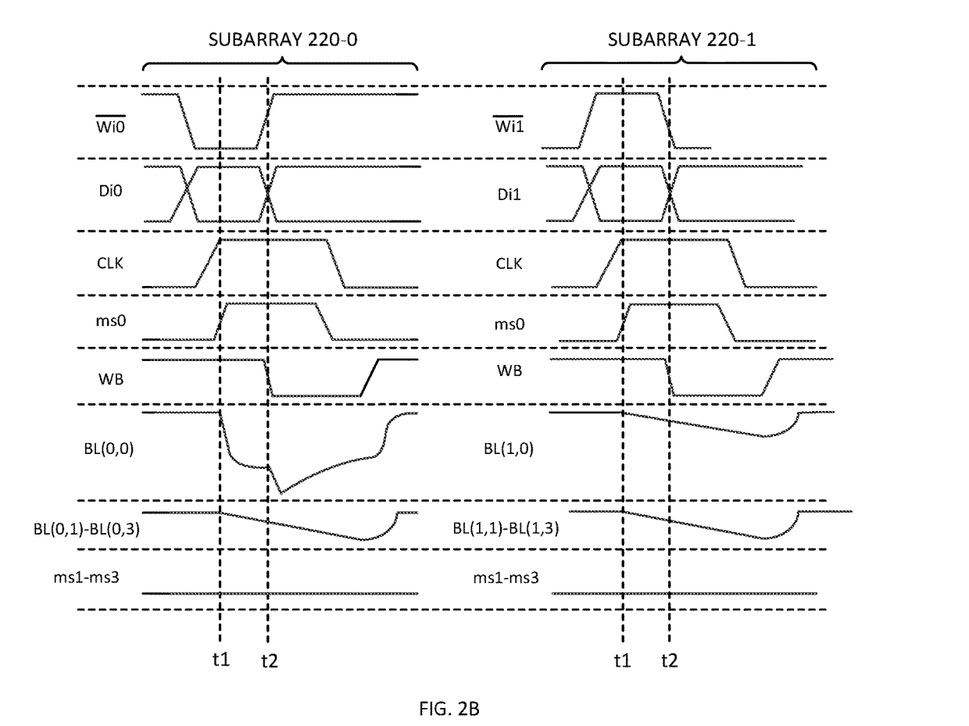
FIG. 2B illustrates a timing diagram of various exemplary signals associated with an operation of the memory circuit of FIG. 2A in accordance with another aspect of the disclosure.

FIG. 2B illustrate timing diagrams of relevant signals for writing data to memory cell C000 of the first subarray 220-0 and masking the writing of data to memory cells of the second subarray 220-1. The left timing diagram pertains to the first subarray 220-0 and the right timing diagram pertains to the second subarray 220-1.

From top to bottom, the signals pertaining to the first subarray 220-0 include the input write mask signal $\overline{W_1 0}$, the input data signal Di0, the clock signal CLK, the column multiplexer select signal bit ms0, the write boost signal WB, the bitline BL(0,0), the other bitlines BL(0,1) to BL(0,3), and the other column multiplexer select signal bits ms1-ms3. Similarly, from top to bottom, the signals pertaining to the second subarray 220-1 include the input write mask signal $\overline{W_1 1}$, the input data signal Di1, the clock signal CLK, the column multiplexer select signal bit ms0, the write boost signal WB, the bitline BL(1,0), the other bitlines BL(1,1) to BL(1,3), and the other column multiplexer select signal bits ms1-ms3.

As a starting assumption, the memory cell C000 is programmed with a logic one (1). That is, the left side of the cross-coupled inverters is at a high logic voltage, and the right side of the cross-coupled inverter is at a low logic voltage. The writing of a logic zero (0) to memory cell C000 operates as follows:

Prior to time t1, the write boost signal WB is at a high logic voltage. The write boost signal WB, being at a high logic voltage, turns on transistor MC0; thereby, grounding the upper terminal (e.g., gate) of the boost capacitor C0. The write boost signal WB is also applied to the lower terminal (e.g., the drain and source) of the boost capacitor C0 via the buffer B0. Accordingly, the write boost signal WB, being at a high logic voltage, charges the boost capacitor C0 during an interval prior to time t1. Thus, the voltage difference across the boost capacitor C0 (from the gate to the drain-source) is a negative voltage. Also, prior to time t1, the wordline WL0 is asserted to couple to memory cell C000 to bitline BL(0,0) and complementary bitline $\overline{BL(0,0)}$.

At time t1, the multiplexer select signal ms0 is asserted to turn on select transistors M00 and $\overline{M00}$. Also, at time t1, the data flip-flop 230-0 and the write mask flip-flop 240-0 output the latched data signal D0 (e.g., a logic zero) and the latched deasserted mask signal (e.g., a logic zero). This causes the OR-gate OR-00 to output a high logic voltage ($\overline{D0}$) and the OR-gate OR-01 to output a low logic voltage (D0). The high logic voltage turns on write transistor M0, and the low logic voltage maintains off complementary write transistor $\overline{M0}$.

Thus, at time t1, the turning on of multiplexer select transistors M00 and $\overline{M00}$ causes the bitline BL(0,0) to begin discharging via transistors M00 and MC0. This is illustrated in the left timing diagram as bitline BL(0,0) (discharging during time interval t1-t2).

At time t2, the write boost signal WB transitions to a low logic voltage. This causes transistor MC0 to turn off, and puts a low logic voltage at the lower terminal of the boost capacitor C0. As a result, the voltage at the gate of the boost capacitor C0 drops to a negative voltage as indicated by the negative peak after time t2. In response, the memory cell C000 changes to a logic zero (0) state indicative of the input data Di0 being written into the memory cell.

As the multiplexer select signal ms1-ms3 for the other bitlines of the subarray 220-0 are at low logic voltages as illustrated, the multiplexer select transistors M01-M03 and $\overline{M01}$-$\overline{M03}$ do not turn on. As a result, the voltages on the corresponding bitlines BL(0,1)-BL(0,3) (as well as the complementary bitlines $\overline{BL(0,1)}$-$\overline{BL(0,3)}$) do not discharge to the same degree as the target complementary bitlines BL(0,0) and $\overline{BL(0,0)}$, as illustrated.

In the case of the second subarray 220-1 (which is not the target of the data writing operation), the write boost signal WB is still applied to the boost capacitor C1. Accordingly, at or before time t1, the write boost signal WB, being at a high logic voltage, causes transistor MC1 to turn on and puts a low logic voltage at the upper terminal (e.g., gate) of the boost capacitor C1. Additionally, the high logic voltage is applied to the lower terminal of the boost capacitor C1 via the buffer B1. As a result, the boost capacitor C1 unnecessarily charges as the second subarray 220-1 is not a target of the writing operation. As a consequence, the voltages on the bitlines BL(1,0)-BL(1,3) (as well as the complementary bitlines $\overline{BL(1,0)}$-$\overline{BL(1,3)}$) due to the unnecessary charging of the boost capacitor C1, as illustrated.

In this example, there are only two subarrays. But, the memory circuit 200 may include many subarrays, and many of which, may not be the target of a writing operation. Accordingly, there would be many unnecessarily charging of corresponding boost capacitors, which results in a substantial waste of power.

Thus, there is a need to mask the write boost signal WB from subarrays that are not target of a writing operation. Additionally, there is a need to unmask the write boost signal WB in a precise time manner so as to prevent writing errors as a result of timing violations.

In summary, one aspect of the disclosure relates to selectively applying the write boost signal WB to one or more subarrays that are the target of a writing operation and masking the write boost signal WB from one or more subarrays that are not the target of the writing operations. As a result, unnecessarily charging of boost capacitors associated with subarrays that are not the target of a writing operation is avoided. This substantially reduces power consumption in memory circuits.

An additional aspect relates to integrating the write masking and unmasking of the bitline with the masking and unmasking of the write boost signal WB. This ensures that the unmasking of the write boost signal WB is performed in a precise timely manner with the unmasking of the bitline so as to prevent or reduce timing violations.

Two exemplary implementations are provided below. A first implementation uses the complementary output of a write mask flip-flop to control the unmasking and masking of the write boost signal WB to and from the boost capacitor. A second implementation uses separate write boost signals WB for selectively charging the corresponding boost capacitors.

Figure 3:
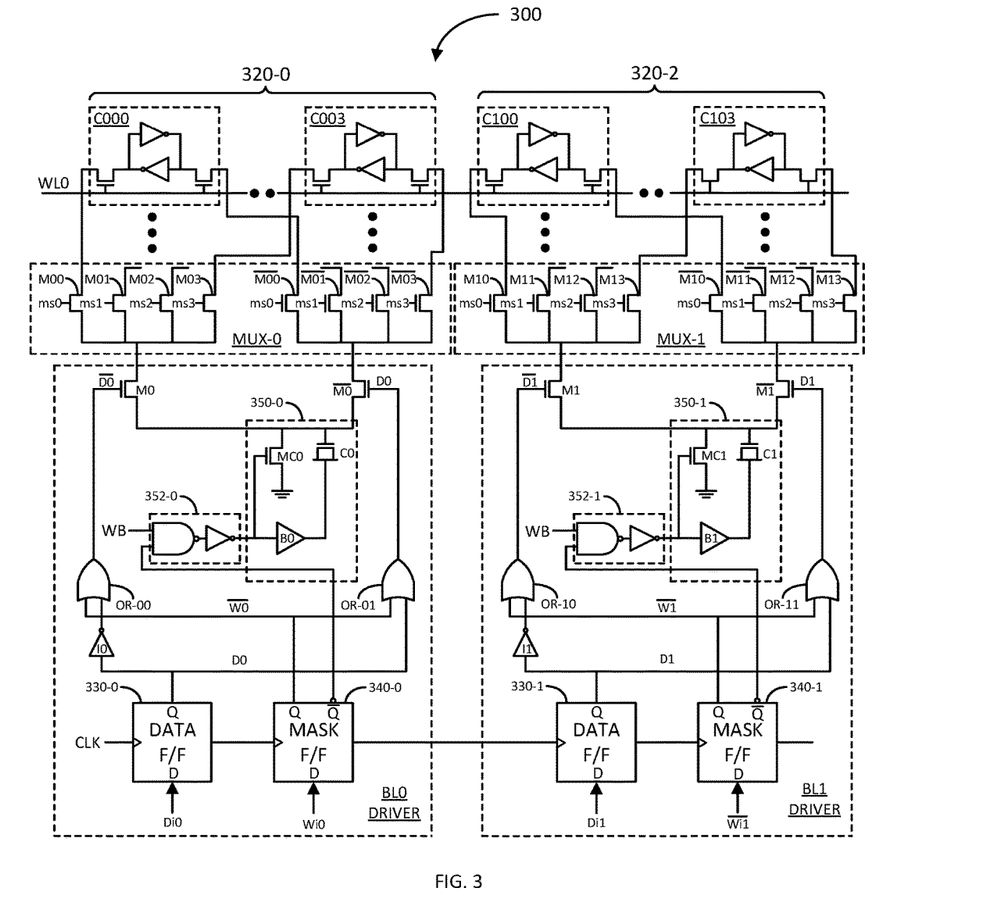
FIG. 3 illustrates a schematic diagram of another exemplary memory circuit in accordance with another aspect of the disclosure.

FIG. 3 illustrates a schematic diagram of another exemplary memory circuit 300 in accordance with another aspect of the disclosure. Similar to memory circuit 200, the memory circuit 300 includes first and second subarrays of memory cells 320-0 and 320-2 coupled to first and second column multiplexers MUX-0 and MUX-1, as previously described. As discussed in more detail below, the memory circuit 300 differs from the memory circuit 200 in that memory circuit 300 includes bitline drivers BL0 and BL1 configured to eliminate unnecessary charging of boost capacitors associated with subarrays that are not the target of a writing operation.

In particular, the bitline driver BL0 includes a data flip-flop 330-0, a write mask flip-flop 340-0, inverter I0, OR-gates OR-00 and OR-01, complementary write transistors M0 and $\overline{M0}$, and a write assist circuit 350-0. The output of the data flip-flop 330-0, which is coupled to the input of the inverter I0 and first input of the OR-gate OR-01, may be from a master latch or a slave latch of the data flip-flop. Similarly, the complementary outputs of the write mask flip-flop 340-0, which are coupled to the second inputs of the OR-gates OR-00 and OR-01 and an input of an AND-gate 352-0, respectively, may be from a master latch or a slave latch of the write mask flip-flop.

The data flip-flop 330-0, write mask flip-flop 340-0, inverter I0, OR-gates OR-00 and OR-01, complementary write transistors M0 and $\overline{M0}$, and the write assist circuit 350-0 are configured similar to the corresponding elements in bitline driver BL0 of memory circuit 200 previously discussed, with the following exception:

The bitline driver BL0 further includes a gating circuit 352-0 (which may be implemented as an AND-gate, or a NAND-gate followed by an inverter as illustrated), and the write mask flip-flop 340-0 includes a complementary data output Q coupled to a first input of the gating circuit 352-0. The gating circuit 352-0 includes a second input configured to receive the write boost signal WB. The gating circuit 352-0 also includes an output coupled to the control terminal (e.g., gate) of transistor MC0 and the input of buffer B0 of the write assist circuit 350-0.

Similarly, the bitline driver BL1 includes a data flip-flop 330-1, a write mask flip-flop 340-1, inverter I1, OR-gates OR-10 and OR-11, complementary write transistors M1 and $\overline{M1}$, and a write assist circuit 350-1. The output of the data flip-flop 330-1, which is coupled to the input of the inverter I1 and first input of the OR-gate OR-11, may be from a master latch or a slave latch of the data flip-flop. Similarly, the complementary outputs of the write mask flip-flop 340-1, which are coupled to second inputs of the OR-gates OR-10 and OR-11 and an input of an AND-gate 352-1, respectively, may be from a master latch or a slave latch of the write mask flip-flop.

The data flip-flop 330-1, write mask flip-flop 340-1, inverter IL OR-gates OR-10 and OR-11, complementary write transistors M1 and $\overline{M1}$, and the write assist circuit 350-1 are configured similar to the corresponding elements in bitline driver BL1 of memory circuit 200 previously discussed, with the following exception:

The bitline driver BL1 further includes a gating circuit 352-1 (which may be implemented as an AND-gate, or a NAND-gate followed by an inverter as illustrated), and the write mask flip-flop 340-1 includes a complementary data output $\overline{Q}$ coupled to a first input of the gating circuit 352-1. The gating circuit 352-1 includes a second input configured to receive the write boost signal WB. The gating circuit 352-1 also includes an output coupled to the control terminal (e.g., gate) of transistor MC1 and input of buffer B1 of the write assist circuit 350-1.

Thus, if data is to be written into a memory cell in the first subarray 320-0 and not into any memory cell in the second subarray 320-1, the gating circuit 352-0 applies the write boost signal WB to the write assist circuit 350-0 in response to the complementary data output Q (e.g., at a high logic voltage) of the write mask flip-flop 340-0, and the gating circuit 352-1 does not apply the write boost signal WB to the write assist circuit 350-1 in response to the complementary data output Q (e.g., at a low logic voltage) of the write mask flip-flop 340-1.

Accordingly, with regard to the target subarray 320-0, the gating circuit 352-0 applies the write boost signal WB to the write assist circuit 350-0 so that a negative voltage may be developed on the selected bitline in order to write the corresponding data to the selected memory cell C. With regard to the non-target subarray 320-1, the gating circuit 352-1 does not apply the write boost signal WB to the write assist circuit 350-1. Instead, the gating circuit 352-1 applies a continuous low logic voltage to the transistor MC1 and boost capacitor C1 via the buffer B1; thereby preventing the charging of the boost capacitor C1. Thus, the unnecessarily charging of the boost capacitor C1 is avoided; thereby, reducing the power consumption in the memory circuit 300.

Since the data output Q of the write mask flip-flop 340-0, being at a low logic voltage, enables the OR-gates OR-00 AND OR-01 for performing a write operation, the complementary data output $\overline{Q}$ of the write mask flip-flop 340-0, being at a high logic voltage, enables the gating circuit 350-0 to apply the write boost signal WB to the write assist circuit 350-0 at substantially the same time. Thus, the application of the write boost signal WB to the write assist circuit 350-0 is at substantially the same time as the application of the latched data D0 and $\overline{D0}$ complementary write transistors M0 and $\overline{M0}$ in order to perform the write operation in a timely manner, without timing violation.

Figure 4:
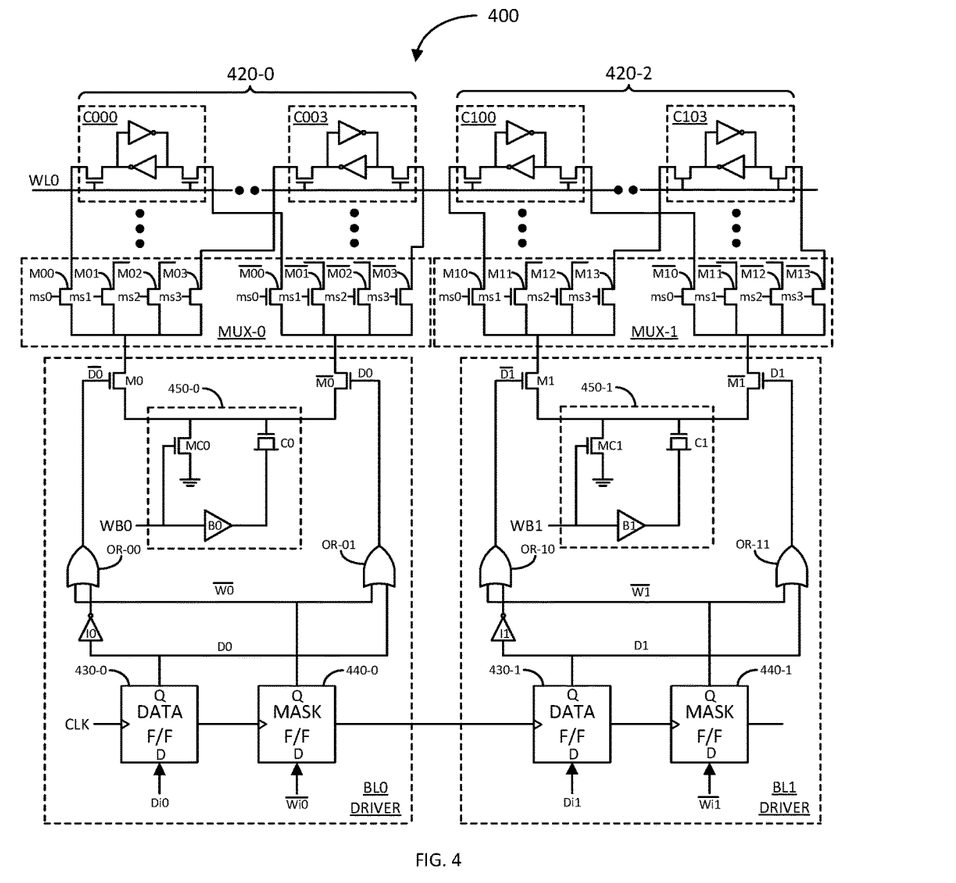
FIG. 4 illustrates a schematic diagram of another exemplary memory circuit in accordance with another aspect of the disclosure.

FIG. 4 illustrates a schematic diagram of another exemplary memory circuit 400 in accordance with another aspect of the disclosure. Similar to memory circuit 200, the memory circuit 400 includes first and second subarrays of memory cells 420-0 and 420-2 coupled to first and second column multiplexers MUX-0 and MUX-1, as previously described. As discussed in more detail below, the memory circuit 400 differs from the memory circuit 200 in that memory circuit 400 includes distinct write boost signals applied to the corresponding write assist circuits. The distinct write boost signals may be generated by a write controller, such as write controller 160 previously discussed.

In particular, the bitline driver BL0 includes a data flip-flop 430-0, a write mask flip-flop 440-0, inverter I0, OR-gates OR-00 and OR-01, complementary write transistors M0 and $\overline{M0}$, and a write assist circuit 450-0. The output of the data flip-flop 430-0, which is coupled to the input of the inverter I0 and first input of the OR-gate OR-01, may be from a master latch or a slave latch of the data flip-flop. Similarly, the output of the write mask flip-flop 440-0, which is coupled to the second inputs of the OR-gates OR-00 and OR-01, may be from a master latch or a slave latch of the write mask flip-flop. The data flip-flop 430-0, write mask flip-flop 440-0, inverter I0, OR-gates OR-00 and OR-01, complementary write transistors M0 and $\overline{M0}$, and the write assist circuit 450-0 are configured similar to the corresponding elements in bitline driver BL0 of memory circuit 200 previously discussed.

Similarly, the bitline driver BL1 includes a data flip-flop 430-1, a write mask flip-flop 440-1, inverter I1, OR-gates OR-10 and OR-11, complementary write transistors M1 and $\overline{M1}$, and a write assist circuit 450-1. The output of the data flip-flop 430-1, which is coupled to the input of the inverter I0 and first input of the OR-gate OR-11, may be from a master latch or a slave latch of the data flip-flop. Similarly, the output of the write mask flip-flop 440-1, which is coupled to the second inputs of the OR-gates OR-10 and OR-11, may be from a master latch or a slave latch of the write mask flip-flop. The data flip-flop 430-1, write mask flip-flop 440-1, inverter I1, OR-gates OR-10 and OR-11, complementary write transistors M1 and $\overline{M1}$, and the write assist circuit 450-1 are configured similar to the corresponding elements in bitline driver BL1 of memory circuit 200 previously discussed.

The bitline drivers BL0 and BL1 of memory circuit 400 differ from bitline drivers BL0 and BL1 of memory circuit 200 in that distinct write boost signals WB0 and WB1 are applied to the write assist circuits 450-0 and 450-1, respectively.

Thus, if data is to be written into a memory cell in the first subarray 420-0 and not into any memory cell in the second subarray 420-1, the write boost signal WB0 is brought up to a high logic voltage to charge the boost capacitor C0 and then brought to a low logic voltage to produce a negative voltage on the bitline to assist in the writing of data to the selected memory cell. With regard to the non-target subarray 420-1, the write boost signal WB1 is maintained at a low logic voltage to prevent the unnecessary charging of the boost capacitor C1; thereby, reducing the power consumption of the memory circuit 400.

Figure 5:
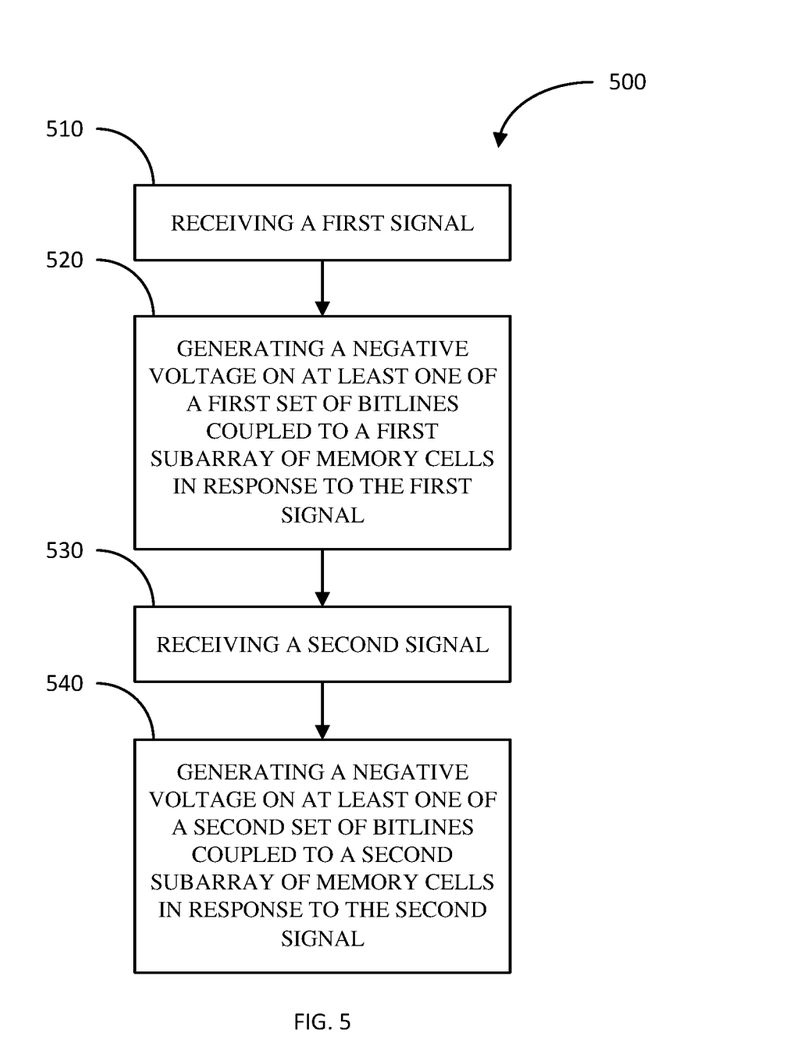
FIG. 5 illustrates a flow diagram of an exemplary method of writing data into a memory circuit in accordance with another aspect of the disclosure.

FIG. 5 illustrates a flow diagram of an exemplary method 500 of writing data into a memory circuit in accordance with another aspect of the disclosure. The method 500 includes receiving a first signal (block 510). Examples of means for receiving a first signal include inputs to the write assist circuits 350-0 and 450-0.

The method 500 further includes generating a negative voltage on at least one of a first set of bitlines coupled to a first subarray of memory cells in response to the first signal (block 520). Examples of means for generating a negative voltage on at least one of a first set of bitlines coupled to a first subarray of memory cells in response to the first signal include write assist circuits 350-0 and 450-0.

The method 500 further includes receiving a second signal (block 530). Examples of means for receiving a second signal include inputs to the write assist circuits 350-1 and 450-1.

The method 500 further includes generating a negative voltage on at least one of a second set of bitlines coupled to a second subarray of memory cells in response to the second signal (block 540). Examples of means for generating a negative voltage on at least one of a second set of bitlines coupled to a second subarray of memory cells in response to the second signal include write assist circuits 350-1 and 450-1.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. An apparatus, comprising:
   an array, comprising:
      a first subarray of memory cells coupled to a first set of bitlines; and
      a second subarray of memory cells coupled to a second set of bitlines;
   a first write assist circuit configured to generate a first negative voltage at a first node in response to a first signal;
   a second write assist circuit configured to generate a second negative voltage at a second node in response to a second signal, wherein the second node is electrically isolated from the first node;
   a first circuit configured to route the first negative voltage from the first node to at least one of the first set of bitlines in response to a third signal; and
   a second circuit configured to route the second negative voltage from the second node to at least one of the second set of bitlines in response to a fourth signal.

2. The apparatus of claim 1, further comprising:
   a first gating circuit configured to generate the first signal in response to a write boost signal and the third signal.

3. The apparatus of claim 2, further comprising:
   a second gating circuit configured to generate the second signal in response to the write boost signal and the fourth signal.

4. The apparatus of claim 1, wherein the first signal comprises a first write boost signal and the second signal comprises a second write boost signal.

5. An apparatus, comprising:
   an array, comprising:
      a first subarray of memory cells coupled to a first set of bitlines; and
      a second subarray of memory cells coupled to a second set of bitlines;
   a first write assist circuit configured to receive a first signal and generate a negative voltage on at least one of the first set of bitlines in response to the first signal;
   a second write assist circuit configured to receive a second signal and generate a negative voltage on at least one of the second set of bitlines in response to the second signal;
   a first gating circuit configured to generate the first signal in response to a write boost signal and a third signal; and
   a write mask flip-flop configured to generate the third signal in response to a deasserted state of a write mask signal.

6. The apparatus of claim 5, wherein the write mask flip-flop comprises a complementary data output configured to produce the third signal.

7. The apparatus of claim 5, wherein the write mask flip-flop comprises a master latch and a slave latch, wherein the third signal is generated by the master latch or the slave latch.

8. An apparatus, comprising:
an array, comprising:
a first subarray of memory cells coupled to a first set of bitlines; and
a second subarray of memory cells coupled to a second set of bitlines;
a first write assist circuit configured to receive a first signal and generate a negative voltage on at least one of the first set of bitlines in response to the first signal;
a second write assist circuit configured to receive a second signal and generate a negative voltage on at least one of the second set of bitlines in response to the second signal;
a first gating circuit configured to generate the first signal in response to a write boost signal and a third signal;
a second gating circuit configured to generate the second signal in response to the write boost signal and a fourth signal; and
a write mask flip-flop configured to generate the fourth signal in response to a deasserted state of a write mask signal.

9. The apparatus of claim 8, wherein the write mask flip-flop comprises a complementary data output configured to produce the fourth signal.

10. The apparatus of claim 8, wherein the write mask flip-flop comprises a master latch and a slave latch, wherein the fourth signal is generated by the master latch or the slave latch.

11. A method, comprising:
receiving a first signal;
generating a first negative voltage at a first node in response to the first signal;
receiving a second signal;
generating a second negative voltage at a second node cells in response to the second signal, wherein the second node is electrically isolated from the first node
routing the first negative voltage from the first node to at least one of a first set of bitlines coupled to a first subarray of an array of memory cells in response to a third signal; and
routing the second negative voltage from the second node to at least one of a second set of bitlines coupled to a second subarray of the array of memory cells in response to a fourth signal.

12. The method of claim 11, further comprising generating the first signal in response to a write boost signal and the third signal.

13. The method of claim 12, further comprising generating the third signal in response to a deasserted state of a write mask signal.

14. The method of claim 12, further comprising generating the second signal in response to the write boost signal and the fourth signal.

15. The method of claim 11, wherein the first signal comprises a first write boost signal and the second signal comprises a second write boost signal.

16. A method, comprising:
receiving a first signal;
generating a negative voltage on at least one of a first set of bitlines coupled to a first subarray of an array of memory cells in response to the first signal;
receiving a second signal;
generating a negative voltage on at least one of a second set of bitlines coupled to a second subarray of the array of memory cells in response to the second signal;
generating the first signal in response to a write boost signal and a third signal;
generating the second signal in response to the write boost signal and a fourth signal; and
generating the fourth signal in response to a deasserted state of a write mask signal.

17. An apparatus, comprising:
means for receiving a first signal;
means for generating a first negative voltage at a first node in response to the first signal;
means for receiving a second signal;
means for generating a second negative voltage at a second node in response to the second signal, wherein the second node is electrically isolated from the first node;
means for routing the first negative voltage from the first node to at least one of a first set of bitlines coupled to a first subarray of an array of memory cells in response to a third signal; and
means for routing the second negative voltage from the second node to at least one of a second set of bitlines coupled to a second subarray of the array of memory cells in response to a fourth signal.

18. The apparatus of claim 17, further comprising means for generating the first signal in response to a write boost signal and the third signal.

19. The apparatus of claim 17, further comprising means for generating the second signal in response to the write boost signal and the fourth signal.

20. The apparatus of claim 17, further comprising means for generating the fourth signal in response to a deasserted state of a write mask signal.

21. The apparatus of claim 17, wherein the first signal comprises a first write boost signal and the second signal comprises a second write boost signal.

22. An apparatus, comprising:
means for receiving a first signal;
means for generating a negative voltage on at least one of a first set of bitlines coupled to a first subarray of an array of memory cells in response to the first signal;
means for receiving a second signal;
means for generating a negative voltage on at least one of a second set of bitlines coupled to a second subarray of the array of memory cells in response to the second signal;
means for generating the first signal in response to a write boost signal and a third signal; and
means for generating the third signal in response to a deasserted state of a write mask signal.

* * * * *